United States Patent
Guo et al.

(10) Patent No.: US 10,205,460 B2
(45) Date of Patent: Feb. 12, 2019

(54) FRACTIONAL-N FREQUENCY SYNTHESIZER AND METHOD THEREOF

(71) Applicant: Beken Corporation, Shanghai (CN)

(72) Inventors: Dawei Guo, Shanghai (CN); Caogang Yu, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 165 days.

(21) Appl. No.: 15/590,776

(22) Filed: May 9, 2017

(65) Prior Publication Data
US 2018/0302097 A1 Oct. 18, 2018

(30) Foreign Application Priority Data
Apr. 18, 2017 (CN) .................... 2017 1 0253994

(51) Int. Cl.
| | | |
|---|---|---|
| *H03L 7/06* | (2006.01) | |
| *H03L 7/18* | (2006.01) | |
| *H03M 7/30* | (2006.01) | |
| *H03B 21/02* | (2006.01) | |
| *H03K 23/68* | (2006.01) | |
| *H03L 7/085* | (2006.01) | |
| *H03L 7/087* | (2006.01) | |
| *H03L 7/089* | (2006.01) | |
| *H03L 7/197* | (2006.01) | |
| *H03M 7/32* | (2006.01) | |

(52) U.S. Cl.
CPC ............ *H03L 7/1976* (2013.01); *H03L 7/087* (2013.01); *H03L 7/0891* (2013.01); *H03B 21/025* (2013.01); *H03K 23/68* (2013.01); *H03L 7/06* (2013.01); *H03L 7/085* (2013.01); *H03L 7/18* (2013.01); *H03M 7/3004* (2013.01)

(58) Field of Classification Search
CPC ..... H03L 7/087; H03L 7/1976; H03M 7/3004
See application file for complete search history.

(56) References Cited

U.S. PATENT DOCUMENTS

| | | | | |
|---|---|---|---|---|
| 2010/0329388 A1* | 12/2010 | Ko | ........................ | H03L 7/081 375/300 |
| 2016/0211855 A1* | 7/2016 | Unruh | ................... | H03L 7/1974 |
| 2016/0248431 A1* | 8/2016 | Luo | ........................ | G06F 1/04 |

* cited by examiner

*Primary Examiner* — Jeffrey M Shin
(74) *Attorney, Agent, or Firm* — Perkins Coie LLP (57) ABSTRACT

A fractional-N frequency synthesizer comprising a multi-phase generator, a multi-path error phase generator; a current combiner; a loop filter connected to the current combiner; an oscillator (150) connected to the loop filter; a frequency divider (160); a SDM connected to both the frequency divider and the multi-phase generator, to generate variable division ratio.

10 Claims, 6 Drawing Sheets

FRACTIONAL-N FREQUENCY SYNTHESIZER AND METHOD THEREOF

CROSS REFERENCE TO RELATED APPLICATIONS

This application claims priority to Chinese Application number 201710253994.1 entitled "fractional-N division frequency synthesizer and method thereof," filed on Apr. 18, 2017 by Beken Corporation, which is incorporated herein by reference.

TECHNICAL FIELD

The present application relates to a mixed-signal circuit and more particularly, but not exclusively, to a fractional-N frequency synthesizer and method therein.

BACKGROUND

Conventional fractional-N frequency synthesizers achieve average non-integer division ratio by modulating a loop frequency divider's dividing ratio. In order to suppress quantization noise, a finite impulse response filter (FIR) with a specific frequency response is introduced into the fractional-N frequency synthesizer' loop, and forms a structure including the FIR filter and components such as in a conventional phase locked loop (PLL). By controlling the frequency response of the FIR filter, suppression of quantization noise in a specific frequency range can be achieved, which improves the performance of the frequency synthesizer.

Conventionally, a FIR filter based quantization noise filter needs a multi-path frequency divider in a frequency synthesizer. Since the loop frequency dividers receive the output of a voltage controlled oscillator (VCO) (in most cases, the VCO frequency is the highest frequency of the frequency synthesizer), multi-path realization inevitably increases power consumption. Further, for the design of a frequency synthesizer including analog modules, multi-path causes increased areas, which also poses a problem since it takes up valuable silicon area on a chip. In addition, due to compact placement of multi-path, the coupling among the frequency dividers will add time errors to each output path, which will further affect the overall performance. Therefore, it may be desirable to design a circuit that improves the performance.

SUMMARY

According to an embodiment of the invention, a fractional-N frequency synthesizer comprises a multi-phase generator configured to generate multiple phase delayed sequences based on an output sequence from a sigma-delta modulator (SDM), a signal processing module configured to calculate a phase difference sequence between each of the multiple delayed sequences and a non-delayed sequence; a multi-path error phase generator connected to the multi-phase generator, configured to generate a plurality of phase difference signals by comparing the phase of each of the phase difference sequence with the phase of a common reference signal; a current combiner connected to the error phase generator and configured to generate a sum of a plurality of charge pump output signals by weighted summing of the plurality of charge pump output signals sourced by each branch within a time window defined by the phase difference sequence; a loop filter connected to the current combiner, and configured to generate a voltage signal by filtering the sum of the plurality of charge pump output signals; an oscillator connected to the loop filter and configured to generate an oscillating voltage signal (CKVCO) according to the voltage signal from the loop filter; a frequency divider configured to sense the oscillating voltage signal and generate a divided signal (CKDIV) by counting pulses of the oscillating voltage signal; a SDM connected to both the frequency divider and the multi-phase generator, to generate variable division ratio (Ndiv).

According to another embodiment of the invention, a method in a fractional-N division frequency synthesizer comprises generating, by a multi-phase generator, multiple phase delayed sequences based on an output sequence from a sigma-delta modulator (SDM), and calculating, by a signal processing module, a phase difference sequence between each of the multiple delayed sequences and a non-delayed sequence; generating, by a multi-path error phase generator, a plurality of phase difference signals by comparing the phase of each of the phase difference sequence the phase of a common reference signal; generating, by a current combiner, a sum of a plurality of charge pump output signals by weighed summing of the plurality of charge pump output signals sourced by each branch within a time window defined by the phase difference sequence; generating, by a loop filter, a voltage signal by filtering the sum of the plurality of charge pump output signals; generating, by an oscillator, an oscillating voltage signal (CKVCO) according to the voltage signal from the loop filter; generating, by a frequency divider, a signal (CKDIV) by sensing the oscillator output and counting pulses of the oscillating signal; and generating variable division ratio by the SDM, wherein the SDM is connected to both the frequency divider and the multi-phase generator.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
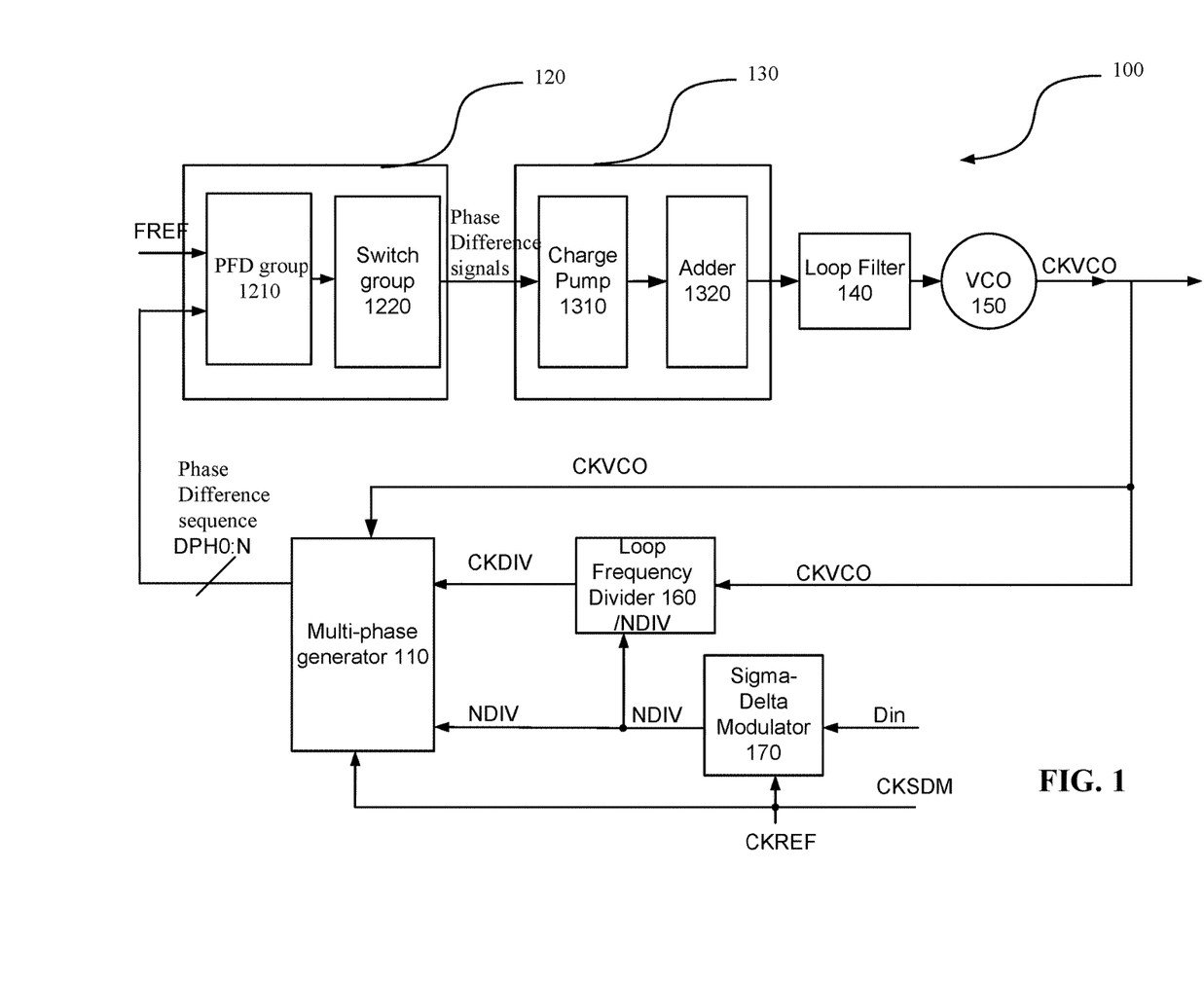
FIG. 1 is a block diagram for a frequency synthesizer according to an embodiment of the invention.

FIG. 1 is a block diagram for a frequency synthesizer 100 according to an embodiment of the invention. The fractional-N frequency synthesizer 100 comprises a multi-phase generator 110, a multi-path error phase generator 120 connected to the multi-phase generator 110, a current combiner 130 connected to the multi-path error phase generator 120, a loop filter 140 connected to the current combiner 130, an oscillator 150 connected to the loop filter 140, a frequency divider 160 (or also called loop frequency divider 160, since it is in a loop) connected to the oscillator 150, and a sigma-delta modulator (SDM) 170 connected to both the frequency divider 160 and the multi-phase generator 110. The multi-phase generator 110 is further connected to the oscillator 150 and the frequency divider 160. The coefficients of the current combiner 130 are determined by the desired filter response. The set of coefficients is programmable (variable) in embodiments. The current combiner 130 can selectively and effectively attenuate certain frequency components and, when it is used for quantizing noises, it can suppress noise.

The multi-phase generator 110 generates multiple phase delayed sequences [NDIV [i−1], NDIV[i−2], . . . , NDIV [i−N]] (NDIV[ ] is further processed to generate DPHi) based on an output sequence NDIV from a sigma-delta modulator (SDM) 170. The Sigma-delta modulator 170 and the frequency divider 160 realize n time-averaged dividing ratio Din by modulating the instantaneous divider ratios. After the frequency divider 160 finishes counting VCO pulses for current N, it will load the count (N+n) for the next time, therefore switching from divider-by-N to divider-by-(N+n). Then, the multi-phase generator 110 generates multiple phase delayed sequences [DPH0, DPH1, . . . DPHN] from the single branch frequency divider 160, by a digital signal processor (DSP) in the multi-phase generator 110 for example, based on the difference between each of the multiple delayed sequences [NDIV[i−1], NDIV[i−2], . . . , NDIV[i−N]] and a non-delayed sequence NDIV[i]. Note the inputs of the DSP are NDIV, which are the outputs of the single branch divider, and the DSP outputs sequences [DPH0, DPH1, . . . DPHN]. The DSP resides in the multi-phase generator 110.

Further, note when the divider ratio is a fractional number, for example, N·M, where N represents the integer part, and M represents the fractional part, the SDM will define when to output N, and when to output N+n, such that SDM will generate a sequence that on average will be N·m.

The multi-phase generator 110 generates multiple paths of delayed sequences [DPH0, DPH1, . . . DPHN] from the single loop frequency divider 160 via a group of shift registers (or latches). A delay between neighboring delay signals among the multiple paths of delayed signals is one Tvco (VCO period). The multi-phase generator 110 generates multiple paths of delayed signals based on the output of the SDM 170, and calculates the phase difference between each path of delayed signals with respect to the non-delayed sequence. The plurality of phase difference signals are treated by adaptive average value adjustment operation, and then converted to address pointer as will be discussed in further detail with respect to FIGS. 3 and 4. In the adaptive average value adjustment, the phase difference value is constantly adjusted to be within the theoretical range. If the instantaneous value exceeds this range, the instantaneous value needs to be added +1 or −1. The adjustment to the instantaneous value becomes the adjustment to average value, as the phase differences are accumulated.

The multi-path error phase generator 120 generates a plurality of phase difference signals [SPUP0, SPDN0, . . . SPUPN, SPDNN] by comparing each of the multiple phase difference sequence [DPH0, DPH1, . . . DPHN] with a common reference phase FREF. The multi-path error phase generator 120 will be discussed in further details below with respect to FIG. 5.

Figure 5:
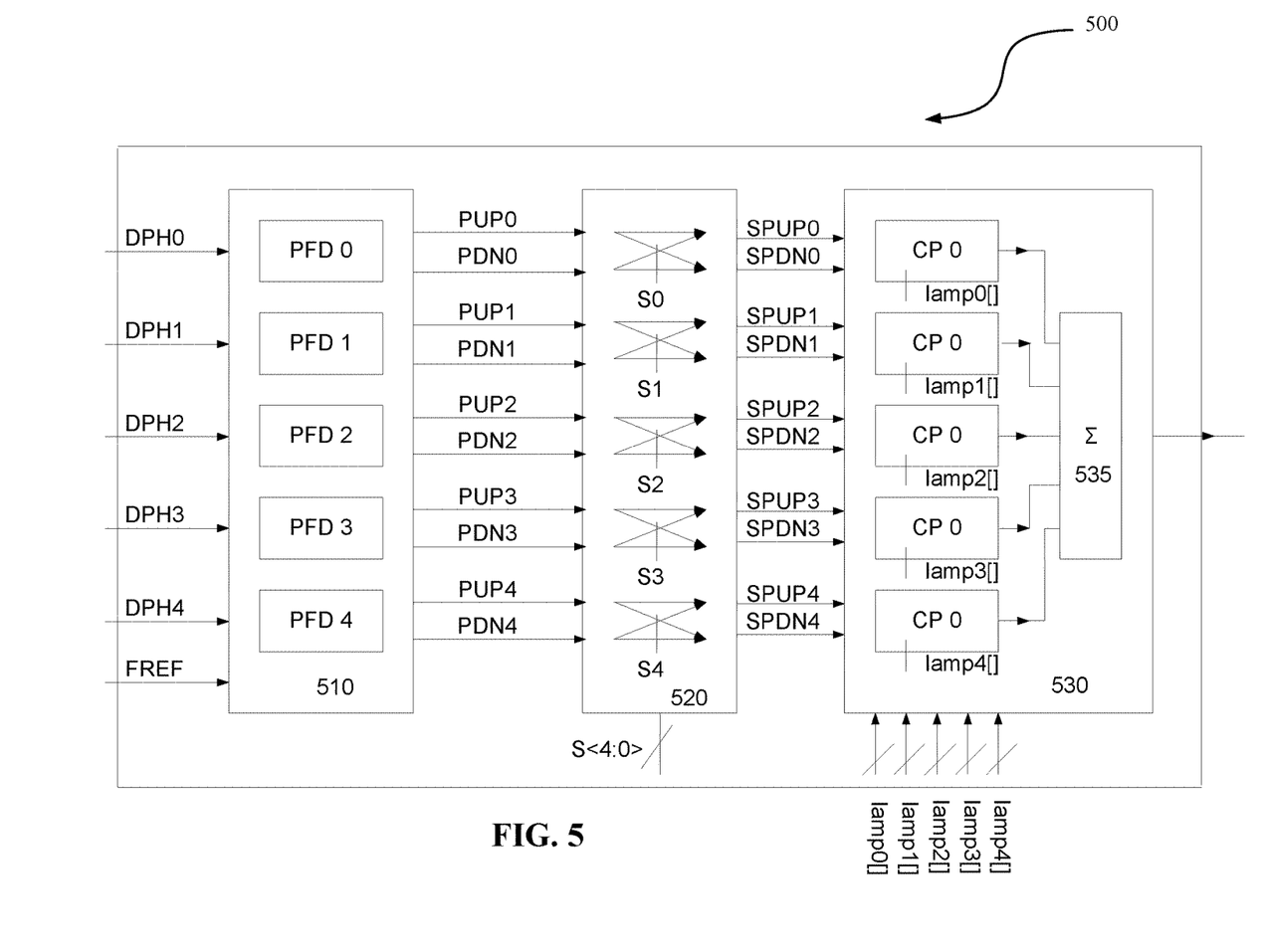
FIG. 5 is a block diagram illustrating the phase detector, the switch group and Finite Impulse Response filter according to an embodiment of the invention.

Further, as shown in FIG. 1 and FIG. 5, the multi-path error phase generator 120 comprises a group of phase detectors 1210 and a switch group 1220. The group of phase detectors 1210 is connected to the multi-phase generator 110. Each of the phase detectors 1210 receives a corresponding delayed sequence DPH0:N from the multi-phase generator 110 and a fixed reference signal FREF, and detects a phase difference [PUP0, PDN0, PUP1, PDN1, . . . PUPN, PDNN] of the received delayed sequence compared with the fixed reference signal FREF. Note sequence DPH0 represents non-delayed signal, sequence DPH1 signal is delayed by one Tvco, that is, a period of VCO, and sequence DPH2 signal is delayed by two Tvco, etc.

Each switch in the switch group 1220 is connected to a corresponding phase detector in the group of phase detectors 1210. The switch 1220 generates a treated phase [SPUP0, SPDN0, . . . SPUPN, SPDNN] by reversing the polarity of the detected phase according to signs of FIR filter coefficients. The switch group 1220 switches the [PUP, PDN] signals within a same group of signals according to the sign S<N:0> of the FIR filter coefficients. The sign is given by desired filter features.

The current combiner 130 further comprises a charge pump 1310 and an adder 1320. The current combiner 130 generates a sum of a plurality of currents with duration proportional to a time window defined by phase difference sequence [DPH0, DPH1, . . . DPHN]. Each current is activated only during the time window defined by phase difference sequence. For example, if phase difference is only 1/10 of the reference cycle, the current is activated for 1/10 of the reference period. The charge pump 1310 sources or sinks electric charge, which is equivalent to a electrical current when average over a time period. Since current is a parameter that is used to describe transfer function of the circuit, it is also commonly used for analyzing the output signal. Alternatively, a charge pump 1310 outputs may be charges, which is the integration of current after the time point when charge pump is activated. The charge pump group 1310 includes a plurality of charge pumps. Each charge pump in the charge pump group 1310 is connected to a corresponding switch in the switch group 1220. Each charge pump generates a current signal by converting the treated phase to current. The amplitude control of each branch within the Multi-branch current pump 1310 is realized by the weight defined by the current combiner coefficients. Further, in the charge domain, the charge pump 1310 adds outputs of all branches, for example over a capacitor and generating a voltage signal. Therefore complete FIR filter is implemented. The current combiner 130 will be discussed in further details with respect to FIG. 5 below.

The loop filter 140 generates a voltage signal by filtering the output of current combiner 130. An oscillator 150 is connected to the loop filter 140. The oscillator 150 generates an oscillating voltage signal CKVCO according to the voltage signal from the loop filter 140. The oscillator 150 may be a VCO.

The loop frequency divider 160 receives the output CKVCO of the oscillator 150, and outputs signal CKDIV of which the frequency is an integer fraction of CKVCO frequency. The multi-phase generator 110 receives both the divided signal CKDIV and the frequency division control signal NDIV[i] generated by the SDM modulator 170 as the inputs. The multi-path error phase generator 120 and the phase detectors (PFD) compares phase differences between each of the output sequence of the multi-phase generator 110 [DPH0, DPH1, DPH2, DPH3, DPH4] and a common reference clock FREF. The output of the current combiner 130 is treated by the loop filter 140 and then generates VCO control voltage to adjust the VCO frequency to achieve the overall closed-loop control. In order to achieve synchronization, the output signal CKVCO of the oscillator and the clock CKSDM for SDM 170 are also fed to the multi-phase generator 110 for participation in the process of multi-phase generation.

The frequency divider 160 senses the oscillating voltage signal CKVCO generated by the oscillator 150 and generates a divided signal (CKDIV) by counting pulses of the oscillating voltage signal CKVCO. For example, in the circuit implementation, the CKDIV is obtained by counting the number of rising edges. Its value is equivalent to the number of CKVCO periods. The rising edge is counted by circuit comprising logic gates. As shown in FIG. 1 and will be discussed further below, Din is the input of SDM 170, which has an integer part and a fractional (or decimal) part. Din is the digital representation of a decimal or fractional value. For example, Din may have 32 bits, which can be represented as Din[31:0]. Din can be further represented as Ni·Nf, wherein Ni represents the integer part of Din, and Nf represents the fractional part of Din. As an example, Ni is represented by the highest 8 bits and Nf by the remaining 24 bits of Din. The SDM 170 is further connected to the Frequency divider 160. The output of SDM 170 to the Frequency divider 160 is an integer value, for example NDIV. Generally, the output of SDM 170 is a random sequence with a given average value, Din in this case. Deviation from this average at any given instance is rather random. For an example, SDM 170 outputs an integer 100 to the frequency divider 160, which means that the frequency divider 110 will count 100 cycles of the input signal, and then generate a signal pulse with a given pulse width.

NDIV represents the output of the SDM 170, which is an integer. The SDM 170 is connected to both the frequency divider 160 and the multi-phase generator 110.

Figure 2:
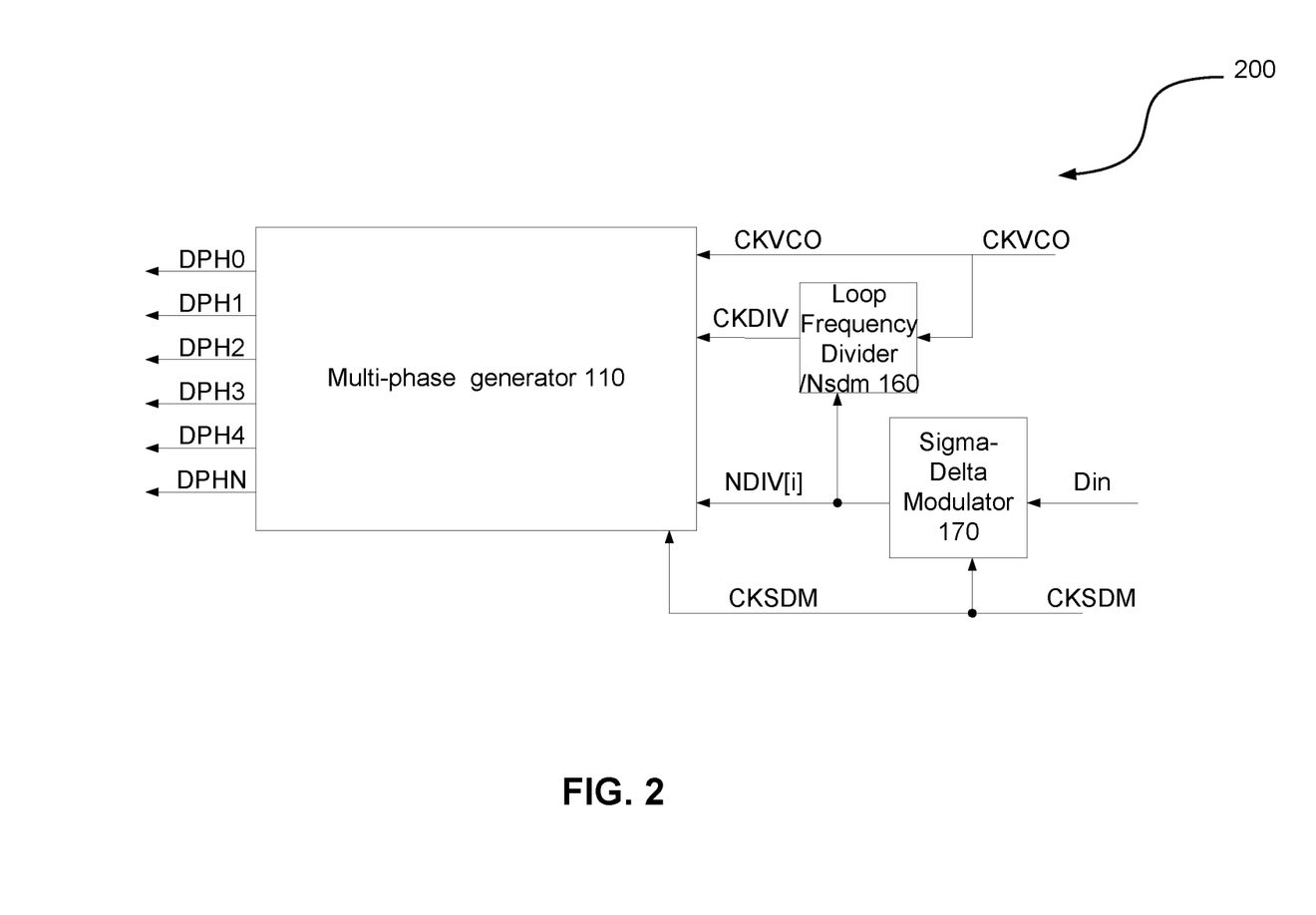
FIG. 2 is a block diagram illustrating a circuit connection among a multi-phase generator, a loop frequency divider and a sigma delta modulator according to an embodiment of the invention.

FIG. 2 is a block diagram illustrating a circuit connection relationship among a multi-phase generator 110, a loop frequency divider 160 and a sigma delta modulator 170 according to an embodiment of the invention. The multi-phase generator 110 is similar to the multi-phase generator 110 shown in FIG. 1. The loop frequency divider 160 is similar to the loop frequency divider 160 shown in FIG. 1. The sigma delta modulator 170 is similar to the sigma delta modulator 170 shown in FIG. 1. The signal CKSDM shown in FIG. 2 is the same as the signal CKREF shown in FIG. 1.

Figure 3:
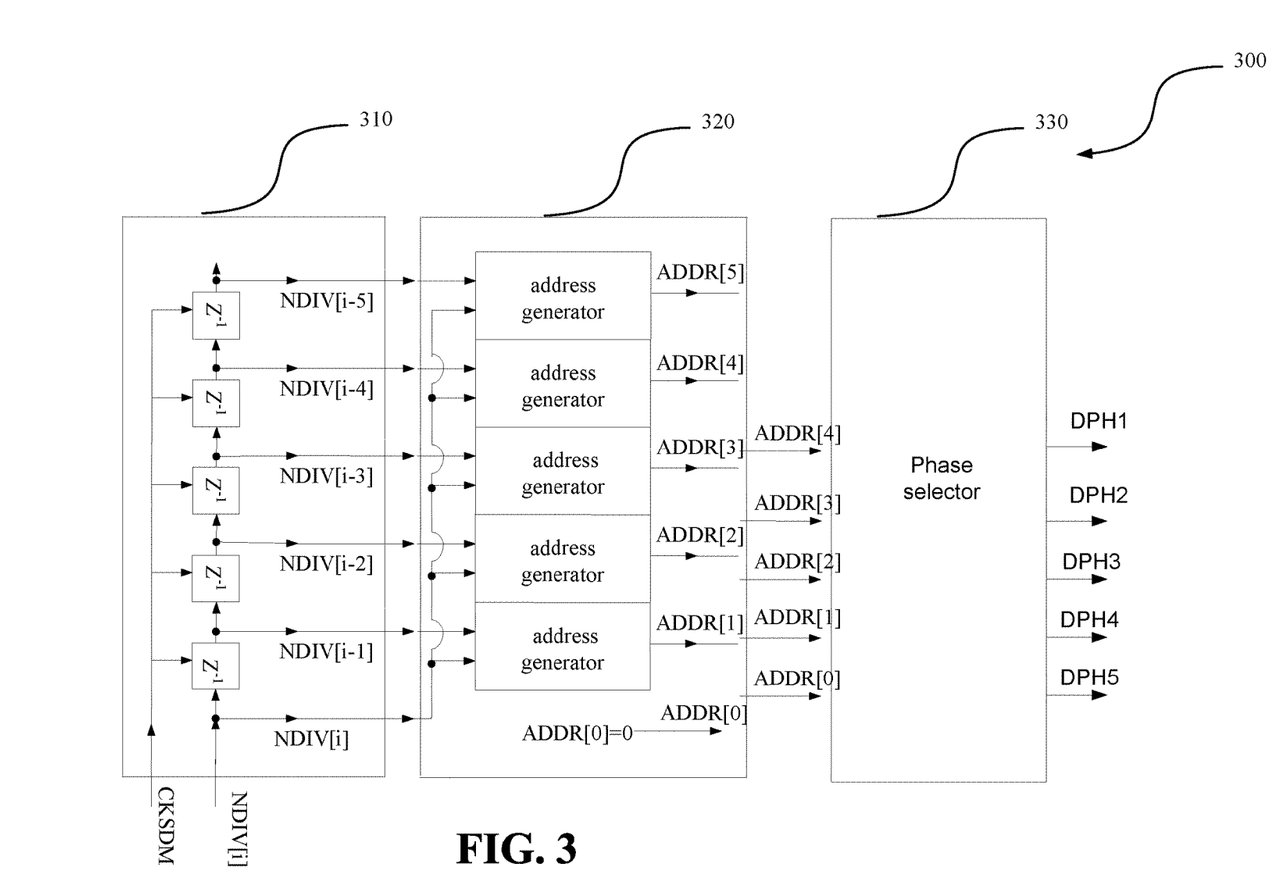
FIG. 3 is a block diagram illustrating a multi-phase generator according to an embodiment of the invention.

FIG. 3 is a block diagram illustrating a multi-phase generator 300 according to an embodiment of the invention. As shown in FIG. 3, the multi-phase generator 300 further comprises a shift register 310 and an address generator 320.

The shift register 310 is connected to the address generator 320 and generates a plurality of shifted sample pointers NDIV[i−1], NDIV[i−2] . . . NDIV[i−5] from a frequency dividing control sequence (NDIV[i]) and a clock signal CKSDM of the SDM 170 also shown in FIG. 1. Note CKSDM is the same as CKREF. As shown in FIG. 3, the shift register 310 comprises a plurality of delaying units $Z^{-1}$ connected in serial that respectively generate internal signals NDIV[i−1], NDIV[i−2] . . . NDIV[i−5] with increased delays. Note when NDIV[i] represents a current frequency divider control signal, NDIV[i−1] represents a frequency divider control signal of one period of CKREF early, and NDIV[i−2] represents a frequency divider control signal of two periods of CKREF early, etc. CKDIV is taken as a reference signal without any delay. In the multi-phase generator, this reference signal passes through multiple delay units, and produces multiple phase signals. Each phase signal is given an address as an index. The address generator 320 uses an algorithm to determine which branch each phase signal is selected to the output.

The address generator 320 generates an address by processing the shifted sample points NDIV[i−1], NDIV[i−2] . . . NDIV[i−5] so as to select a signal with correct phase with an address pointer ADDR[ ]. ADDR[ ] may be in the range from ADDR[0] to ADDR[4]. As the generation of the address pointer requires historical value for frequency dividing ratio, the historical value for frequency dividing ratio is stored in the shift register 310 or address generator 320. For example, the registers of the address generator 320 stores the offset with respect to the non-delayed signal. For example, the register of ADDR[2] stores NDIV[i−2] of 2 delay unit, which means delay by 2 units with respect to non-delayed signal. The delay unit may be counted in terms of Tvco, or the period of VCO. Therefore 2 delay units mean 2Tvco. The address generator 320 outputs the addresses ADDR[0], ADDR[1], ADDR[2], ADDR[3] and ADDR[4] that are respectively corresponding to the output phase sequences DPH0, DPH1, DPH2, DPH3, DPH4. The number of signals generated in multi-phase generator may be more than the number of signals that have different phases. The specific number may be determined by the design requirements.

Then the multi-phase generator 300 outputs phase sequences DPH0, DPH1, DPH2, DPH3, DPH4 corresponding to the respective addresses ADDR[0], ADDR[1], ADDR[2], ADDR[3] and ADDR[4]. For example, the multi-phase generator 300 further comprises a phase selector 330 connected to the address generator 320. The phase selector 330 uses the output address generated by the address generator 320, and sequentially selects multiple output signals from multi-phase generator 300. The selected output signal is re-sampled with the clock of VCO CKVCO, and the output sequence DPH1, DPH2, DPH3 . . . is connected to the phase detector 1210. The resample operation may reduce or eliminate time errors that may add phase error to the system. In the resample operation, CKVCO functions as a clock signal to sample the output phase signals. As the resampling takes the VCO period as a unit, it eliminates the non-integer VCO cycle delay. The shift register 310 generates multi-phase signal, wherein each branch has a corresponding pointer. The address generator 320 generates a plurality of addresses, wherein each address of the plurality of addresses corresponds to a pointer of a corresponding phase. The phase selector 330 outputs the corresponding phase signals according to each output pointer.

Figure 4:
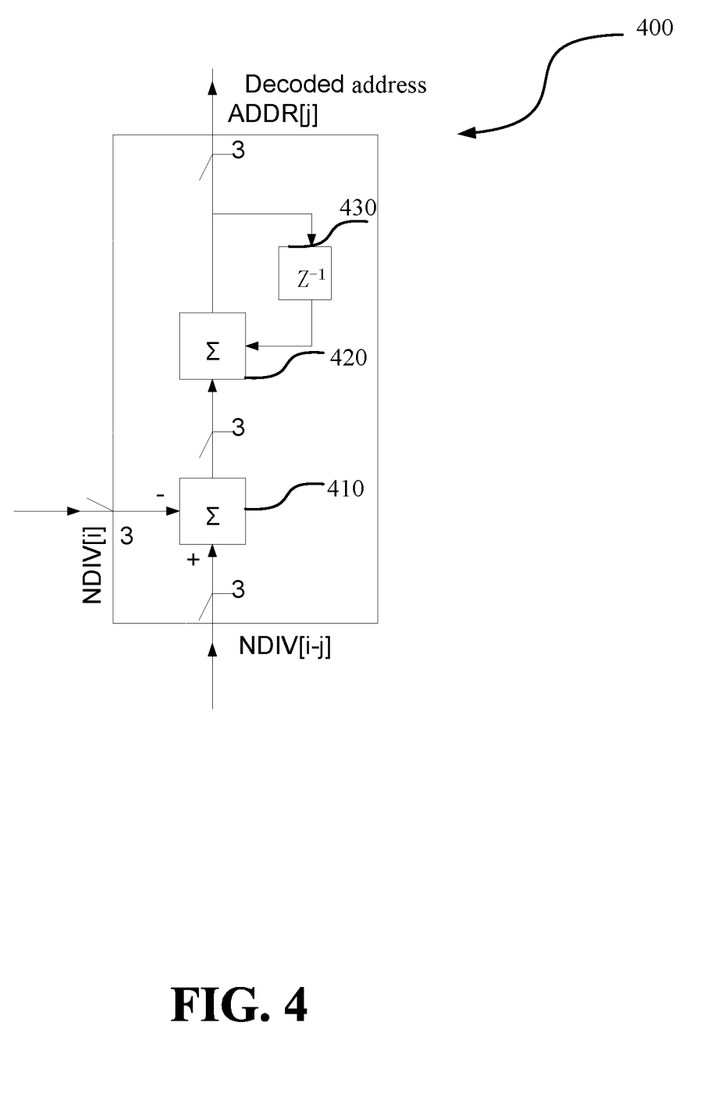
FIG. 4 is a block diagram illustrating an address generator according to an embodiment of the invention.

FIG. 4 is a block diagram illustrating an address generator 400 according to an embodiment of the invention. The address generator 400 further performs adaptive average value adjustment operation. In an embodiment, the address generator 400 further comprises a first adder 410, a second adder 420, and a delaying unit 430. The first adder 410 generates a difference by subtracting an non-delayed sample point NDIV[i] from the shifted sample points NDIV[i−j]. The second adder 420 is connected to the first adder 410. The second adder 420 generates a sum by adding the difference NDIV[i]−NDIV[i−j] with a previous difference NDIV[i−1]−NDIV[i−j−1]. The second adder 420 further outputs the address ADDR[j].

For the operation principle, the charge-pump 1310 operates in electrical charge domain, and the output of the current combiner 130 can be expressed as $$Q[n]=a0*X[n-0]+a1*X[n-1]+a2*X[n-2]+\ldots+am*X[n-m]$$

Wherein a0, a1, . . . , am are the FIR filter coefficients, and X [n−i] is the phase difference sequence {X [i]} that is i sample behind of X [n]. Taking into account the linear transfer characteristic of the phase detector 1210 and charge pump 1310, Q [n] can be expressed as $$Q[n]=b0*PH[n-0]+b1*PH[n-1]+b2*XPH[n-2]+\ldots+bm*PH[n-m];$$

Wherein the sequence {PH [i]} is phase difference equivalence at the phase detector's inputs. The relationship between PH [n] and loop divider ratio NDIV can be expressed as follows:

$$PH[n]=\Sigma^n\{NDIV[j]-Din\};$$

Wherein NDIV [j] is sample points for NDIV, and Din is the fractional input of the loop SDM 170. The fractional input can be also called decimal input.

Based on the expression of PH [n], $$DPH[i]=PH[n-i]-PH[n]=\Sigma^n_j(NDIV[j-i]-NDIV[j]),$$
by summing all j.

Since the sequence {NDIV [ ]} is the output of SDM 170 and calculated by SDM 170, and {NDIV [ ] } is an integer, $Rn=\Sigma^n_j(NDIV[j-i]-NDIV[j])$ is also an integer, and after the value is treated with adaptive mean adjustment, the value will be in the minimum scope. When the mean value is correct, the data is theoretically within the minimum range. On the contrary, if the data exceeds the range, it means that the mean value deviates. The mean value is then adjusted according to the direction of the deviation, until no deviation from the minimum range is presents.

From the above equations, once PH [n] is known, PH [n−i] can be obtained by delaying Rn samples (the sampling period is Tvco).

FIG. 5 is a block diagram illustrating a phase detector 510, a switch group 520 and a Finite Impulse Response filter 530 according to an embodiment of the invention.

The phase detector array 510 {PFD0, . . . , PFD4} receives the output sequences of the Multi-phase generator 110, {DPH0, DPH1, DPH2, DPH3, DPH4}, and compares each of them with a reference clock FREF to generate a plurality of UP and DOWN signals: {PUP0, PDN0}, . . . , {PUP4, PDN4}. Depending on the sign bit S<4:0> of the FIR filter 530's coefficients, the switch group 520 maintains the original polarity, or reverses the polarity. The switch group 520 then outputs signals {SPUP0, SPDN0}, . . . , {SPUP4, SPDN4} as the control signal for various branches of charge pumps CP0 within the FIR filter 530. The amplitude of each branch is controlled by coefficients of the FIR filter, Iamp0 [ ], Iamp1 [ ], Iamp2 [ ], Iamp3 [ ], Iamp4 [ ]. The output currents of the plurality of charge pumps are summed by the adder 535, and outputted to the loop filter device 160 shown in FIG. 1. The coefficients are selected according to the noise suppression requirement from the system design. Of course, there may be more than one set of coefficients to choose from and one set can be selected at a given time.

In fractional-N frequency synthesizer 100, the phase difference PH [n] is the difference between the output of single loop frequency divider 160 CKDIV [n], and the reference clock CKREF. The multi-phase generator 110 further delays the CKDIV[n] by units (1 unit an VCO period, Tvco), and inputs the delayed CKDIV[n] into another phase detector, to compare the delayed CKDIV[n] with the same reference clock CKREF, and outputs phase difference PH [n−i]. Therefore, based on one-path divider, delay units, multi-channel phase detector and charge pump, FIR filter can be enabled to suppress loop quantization noise. The sign bit for coefficients of the filter can be achieved by switching the output of the phase detector, and the absolute value of the coefficient can be implemented by the magnitude of the current in the charge pump.

Figure 6:
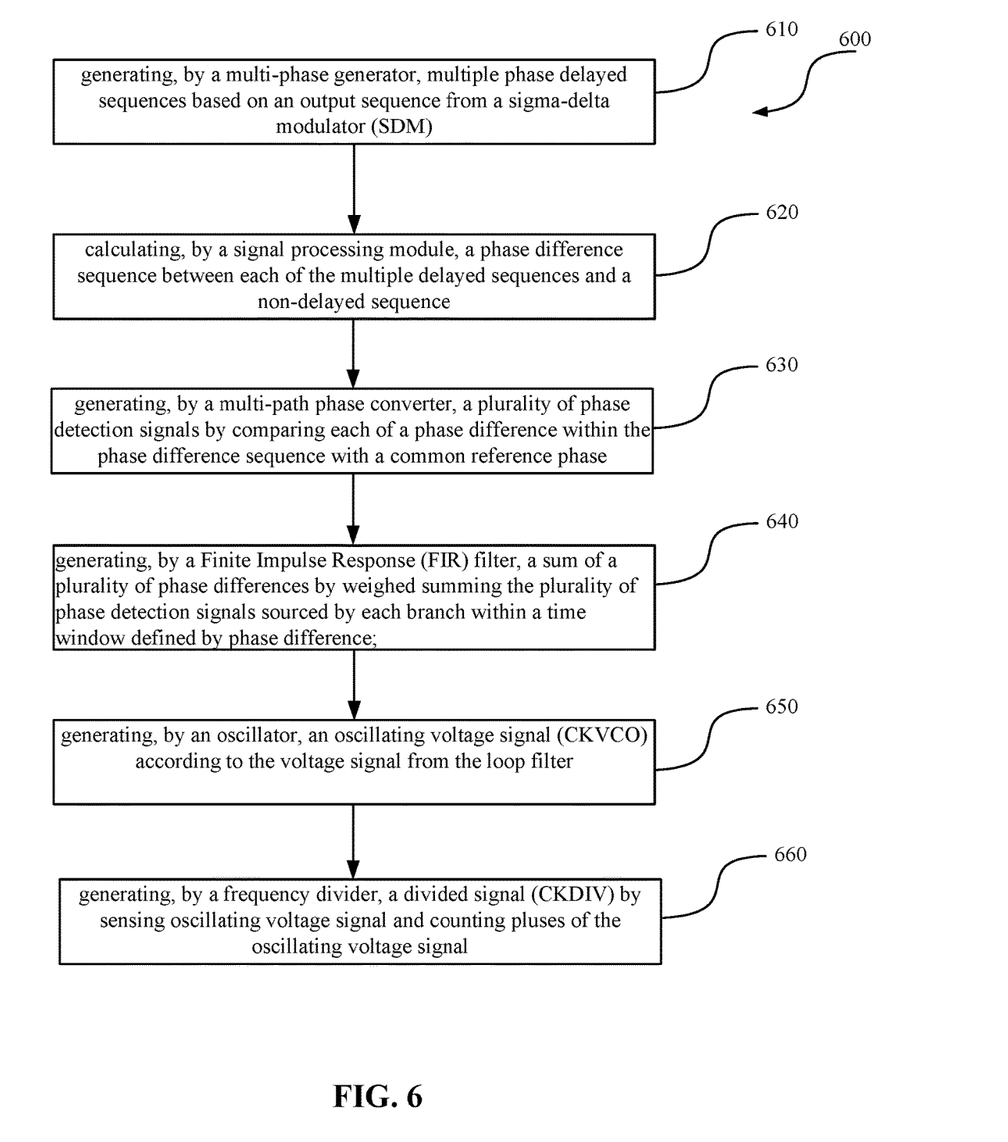
FIG. 6 is a flow chart illustrating a method in a frequency synthesizer according to an embodiment of the invention.

FIG. 6 is a flow chart illustrating a method 600 in a frequency synthesizer according to an embodiment of the invention.

The method 600 in a fractional-N division frequency synthesizer comprises generating, by a multi-phase generator in block 610, multiple phase delayed sequences based on an output sequence from a sigma-delta modulator (SDM); calculating, by a signal processing module in block 620, a phase difference sequence between each of the multiple delayed sequences and a non-delayed sequence; generating, by a multi-path error phase generator in block 630, a plurality of phase difference signals by comparing phase of each of a delayed sequence with a common reference phase; generating, by a current combiner in block 640, a sum of charge pump output signals by weighed summing the plurality of charge pump output signals sourced by each branch within a time window defined by phase difference; generating, by a loop filter in block 650, a voltage signal by filtering the sum of the plurality of charge pump output signals; generating, by an oscillator in block 650, an oscillating voltage signal (CKVCO) according to the voltage signal from the loop filter; generating, by a frequency divider in block 660, a divided signal (CKDIV) by sensing the oscillating voltage signal and counting pulses of the oscillating voltage signal; and wherein the SDM is connected to both the frequency divider and the multi-phase generator.

Alternatively, the multi-path error phase generator comprises a group of phase detectors connected to the multi-phase generator and a switch group, and each of the switch in the switch group is connected to a corresponding charge pump in a charge pump group, and the method further comprises (not shown in drawings) receiving, by each of the phase detectors, a corresponding phase delayed signal from the multi-phase generator and a fixed reference signal and detect a phase difference of the received delayed sequence; switching, by each of the switch in the switch group, a polarity of the detected phase according to an sign indication of the FIR filter to generate treated phase; and generating, by a charge pump a current signal by converting the treated phase to current.

Alternatively, the multi-phase generator further comprises a shift register, a address generator, wherein the shift register is connected to the address generator, and the address generator connected to the shift register, and the method further comprises generating, by the frequency shifter, a plurality of shifted sample points (NDIV[i−1], NDIV [i−2] . . . NDIV[i−5]) from a frequency dividing control signal (NDIV[i]); generating by the address generator, an address by decoding an address of the plurality of the shifted sample points.

Alternatively, the method 600 further comprises (not shown in drawings) performing, by the address generator, adaptive average value adjustment operation.

Alternatively, the address generator further comprises a first adder, a second adder, a delaying unit, wherein the method further comprises (not shown in drawings) generating, by the first adder, a difference by subtracting an non-delayed sample point from the shifted sample points; generating, by the second adder, a sum by adding the difference with a delayed difference, wherein the delayed difference is delayed from the output of the second adder; and outputting, by the second adder, the address.

Embodiments of the invention introduces FIR filter into a single frequency divider architecture. Embodiments of the frequency synthesizer utilizes the feature that the coefficients of FIR filter can be programmed flexibly to selectively suppress quantization noise, therefore realizing low power consumption and improve the performance of the frequency synthesizer, and reduce the area (cost).

Although the present invention has been described with reference to specific exemplary embodiments, the present invention is not limited to the embodiments described herein, and it can be implemented in form of modifications or alterations without deviating from the spirit and scope of the appended claims. Accordingly, the description and the drawings are to be regarded in an illustrative rather than a restrictive sense.

From the foregoing, it will be appreciated that specific embodiments of the technology have been described herein for purposes of an illustration; however various modifications can be made without deviating from the spirit and scope of the present invention. Accordingly, the present invention is not restricted except in the spirit of the appended claims.

Other variations to the disclosed embodiments can be understood and effected by those skilled in the art in practicing the claimed invention, from a study of the drawings, the disclosure, and the appended claims. In the claims the word "comprising" does not exclude other elements or steps, and the indefinite article "a" or "an" does not exclude a plurality. Even if particular features are recited in different dependent claims, the present invention also relates to the embodiments including all these features. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

What is claimed is:

1. A fractional-N frequency synthesizer comprising:
   a multi-phase generator configured to generate multiple phase delayed sequences based on an output sequence from a sigma-delta modulator (SDM),
   a signal processing module configured to calculate a phase difference sequence between each of the multiple delayed sequences and a non-delayed sequence;
   a multi-path error phase generator connected to the multi-phase generator, configured to generate a plurality of phase difference signals by comparing the phase of each of the phase difference sequence with the phase of a common reference signal;
   a current combiner connected to the error phase generator and configured to generate a sum of a plurality of charge pump output signals by weighted summing of the plurality of charge pump output signals sourced by each branch within a time window defined by the phase difference sequence;
   a loop filter connected to the current combiner, and configured to generate a voltage signal by filtering the sum of the plurality of charge pump output signals;
   an oscillator connected to the loop filter and configured to generate an oscillating voltage signal (CKVCO) according to the voltage signal from the loop filter;
   a frequency divider configured to sense the oscillating voltage signal and generate a divided signal (CKDIV) by counting pulses of the oscillating voltage signal;
   a SDM connected to both the frequency divider and the multi-phase generator, to generate variable division ratio (Ndiv).

2. The fractional-N division frequency synthesizer of claim 1, wherein the multi-path error phase generator further comprises:
   a group of phase detectors connected to the multi-phase generator, wherein each of the phase detectors is configured to receive a corresponding delayed sequence from the multi-phase generator and a fixed reference signal, and detect a phase difference of the received delayed sequence;
   a switch group, each of a switch in the switch group is connected to a corresponding phase detector, and configured to generate a treated phase by reversing the polarity of the detected phase according to an sign indication from the current combiner; and wherein the charge combiner further comprises
   a charge pump group, wherein each of a charge pump in the charge pump group is connected to a corresponding switch in the switch group, and configured to generate a current signal by converting the treated phase to current.

3. The fractional-n division frequency synthesizer of claim 1, wherein the multi-phase generator further comprises a shift register, an address generator, wherein
   the shift register is connected to the address generator output and configured to generate a plurality of shifted sample points (NDIV[i−1], NDIV[i−2] . . . NDIV[i−5]) from a frequency dividing control signal (NDIV[i]);
   the address generator output connected to the shift register and configured to generate an address by decoding an address of the plurality of the shifted sample points.

4. The fractional-N division frequency synthesizer of claim 3, wherein the address generator is further configured to perform adaptive average value adjustment operation.

5. The fractional-N division frequency synthesizer of claim 3, wherein the address generator further comprises a first adder, a second adder, a delaying unit, wherein
   the first adder is configured to generate a difference by subtracting a non-delayed sample point from the shifted sample points;
   the second adder is configured to generate a sum by adding the difference with a delayed difference, wherein the delayed difference is delayed from the output of the second adder; and the second adder is further configured to output the address.

6. A method in a fractional-N division frequency synthesizer comprising:

generating, by a multi-phase generator, multiple phase delayed sequences based on an output sequence from a sigma-delta modulator (SDM), and calculating, by a signal processing module, a phase difference sequence between each of the multiple delayed sequences and a non-delayed sequence;

generating, by a multi-path error phase generator, a plurality of phase difference signals by comparing the phase of each of the phase difference sequence the phase of a common reference signal;

generating, by a current combiner, a sum of a plurality of charge pump output signals by weighed summing of the plurality of charge pump output signals sourced by each branch within a time window defined by the phase difference sequence;

generating, by a loop filter, a voltage signal by filtering the sum of the plurality of charge pump output signals;

generating, by an oscillator, an oscillating voltage signal (CKVCO) according to the voltage signal from the loop filter;

generating, by a frequency divider, a signal (CKDIV) by sensing the oscillator output and counting pulses of the oscillating signal; and generating variable division ratio by the SDM, wherein the SDM is connected to both the frequency divider and the multi-phase generator.

7. The method of claim 6, wherein the multi-path error phase generator comprises a group of phase detectors connected to the multi-phase generator and a switch group, and each of the switch in the switch group is connected to a corresponding charge pump in a charge pump group, and the method further comprises receiving, by each of the phase detectors, a corresponding delayed sequence from the multi-phase generator and a fixed reference signal and detect a phase difference of the received delayed sequence;

reversing, by each of the switch in the switch group, a polarity of the detected phase according to an sign indication from the current combiner to generate treated phase; and generating, by a charge pump a current signal by converting the treated phase to current.

8. The method of claim 6, wherein the multi-phase generator further comprises a shift register, an address generator, wherein the shift register is connected to the address generator, and the address generator connected to the shift register, and the method further comprises generating, by the frequency shifter, a plurality of shifted sample points (NDIV[i−1], NDIV[i−2]... NDIV[i−5]) from a frequency dividing control signal (NDIV[i]);

generating by the address generator, an address by decoding an address of the plurality of the shifted sample points.

9. The method of claim 8, further comprises performing, by the address generator, adaptive average value adjustment operation.

10. The method of claim 8, wherein the address generator further comprises a first adder, a second adder, a delaying unit, wherein the method further comprises generating, by the first adder, a difference by subtracting a non-delayed sample point from the shifted sample points;

generating, by the second adder, a sum by adding the difference with a delayed difference, wherein the delayed difference is delayed from the output of the second adder; and outputting, by the second adder, the address.

* * * * *